United States Patent [19]

Pender et al.

[11] Patent Number: 5,232,501
[45] Date of Patent: Aug. 3, 1993

[54] APPARATUS FOR PROCESSING PRINTED CIRCUIT BOARD SUBSTRATES

[75] Inventors: Don P. Pender; Marshall I. Gurian, both of Tempe, Ariz.

[73] Assignee: Advanced Systems Incorporated, Phoenix, Ariz.

[21] Appl. No.: 839,617

[22] Filed: Feb. 21, 1992

[51] Int. Cl.[5] ............................................. B05C 5/00
[52] U.S. Cl. ........................................ 118/300; 118/324
[58] Field of Search .......................... 198/493; 74/416; 118/200, 300, 324, 325

[56] References Cited

U.S. PATENT DOCUMENTS 4,607,590  8/1986  Pender ................................ 118/325

Primary Examiner—W. Gary Jones
Assistant Examiner—Charles K. Friedman
Attorney, Agent, or Firm—Tod R. Nissle

[57] ABSTRACT

Apparatus for contacting a circuit board substrate with etching fluid or some other chemical includes a conveyor system comprised of upper and lower rotating disks for receiving and transporting the circuit board substrate while the substrate is contacted with fluid. The apparatus utilizes a modular drive system to drive the disks. The drive system is not exposed to the chemicals used to contact and process the circuit board substrate. The rotating disks can be removed from the apparatus without requiring disassembly of the modular drive system.

5 Claims, 3 Drawing Sheets

APPARATUS FOR PROCESSING PRINTED CIRCUIT BOARD SUBSTRATES

This invention relates to apparatus for processing printed circuit board substrates.

More particularly, the invention concerns apparatus for contacting a circuit board substrate with etching or other fluid, the apparatus including a conveyor system comprised of opposed upper and lower rotating disks for receiving and transporting a circuit board substrate while the substrate is being contacted with fluid.

In another respect, the invention concerns circuit board substrate apparatus of the type described which includes a modular drive system for imparting motive power to the upper and lower rotating disks, which does not expose gear mechanisms in the modular drive system to chemicals used to process the circuit board substrate, and which permits the upper and lower rotating disks to be removed with requiring that the modular drive system be disassembled, in whole or in part.

Involute apparatus for spraying rectilinear circuit board substrate material is well known in the art. See, for example, U.S. Pat. No. 4,607,590 to Pender. In Pender a conveyor system moves panels of circuit board substrate material past units which direct spray against the upper and lower planar surfaces of the substrate. The conveyor system includes a series of parallel, spaced apart rotating axles each fixedly carrying a plurality of vertically disposed isodiametric spaced apart disks. As shown in FIG. 1 of Pender, the intercatenated disks of one syndetic axle can be staggered in relation to the disk on immediately adjacent axles in the same manner that adjacent rows of seats in a movie theater are staggered. Further, the spaced disks on one axle can, as is the case with the disks on axles 42, 43, 44 in FIG. 1 of Pender, extend past an imaginary line tangential to the periphery of the disks on an adjacent syndetic axles and, therefore, can extend into the interstices between the disks carried by the adjacent axle. Alternatively, the spaced disks on one axle do not have to extend past the imaginary line tangential to the periphery of the disks on an adjacent syndetic axle and, therefore, need not extend into the interstices between the disks carried by the adjacent axle. In other words, the disks on one axle need not intermesh with the disks on adjacent axles.

Regardless of whether the disks on adjacent axles intermesh, prior art systems typically utilize a disk drive which includes gearing that is exposed to the fluid sprays and fluid baths applied to circuit board substrate carried by the disks. The fluids in such sprays and baths often is corrosive and adheres to the gearing in the drive system, increasing the maintenance required to maintain the drive system in appropriate working order. Another disadvantage to prior art drive systems is that when a gear or other component in the system must be replaced, the drive system must, either in large part or in its entirety, be disassembled. Similarly, prior art disk drive systems require that the drive system be disassembled when it is desired to remove a disk bearing axle from the circuit board processing apparatus.

Accordingly, it would be highly desirable to provide improved apparatus for directing fluid streams against a circuit board substrate being transported on rotating disks powered by a drive system.

It would also be highly desirable to provide an improved circuit board substrate processing apparatus of the type described in which the drive system did not include gear components exposed to liquid sprays used to process circuit board substrates and did not require that the drive system be largely disassembled during replacement of parts in the drive system or during the removal of rotating disks from the processing apparatus.

These and other, further and more specific objects and advantages of the invention will be apparent to those skilled in the art from the following detailed description thereof, taken in conjunction with the drawings, in which:

Briefly, in accordance with my invention, I provide improved apparatus for contacting with a fluid a substrate traveling through the apparatus. The substrate has first and second opposed generally parallel planar surfaces co-terminating at the edge defining the periphery of the substrate. The improved apparatus includes a conveyor table for transporting the substrate, means for contacting the substrate with a fluid, and drive means. The conveyor table includes a frame and a plurality of generally horizontally disposed spaced apart parallel axles mounted for rotation in the frame. The frame includes a pair of spaced apart upstanding first and second wall means. Each of the side wall means includes an inner and an outer surface. The inner surfaces of the side wall means are exposed to fluid contacting the substrate. The outer surfaces of the side wall means face outwardly away from the inner surfaces and generally are not exposed to contact by fluid applied to the substrate. The parallel axles each carry a plurality of spaced apart circular rollers. The rollers support the first planar surface of the substrate in a generally horizontal orientation as the substrate is moved over the rollers. The axles each include a first end and a second end. The drive means rotates the axles and the circular rollers carried thereon to cause the substrate to move over the rollers and along the conveyor table in a direction of travel generally perpendicular to the longitudinal axes of the axles. The drive means includes a shaft rotatably mounted in the first side wall means and having an inner end removably engaging the first end of the axle, and an outer end extending outwardly from the outer surface of the first side wall; a gear attached to the outer end of the shaft; and, means to rotate the gear, the shaft, and the axle. The shaft is shaped and dimensioned such that when the housing is detached and pulled away from the first side wall means, the inner end slides free from the first end of the axle and from the first side wall means.

Figure 1:
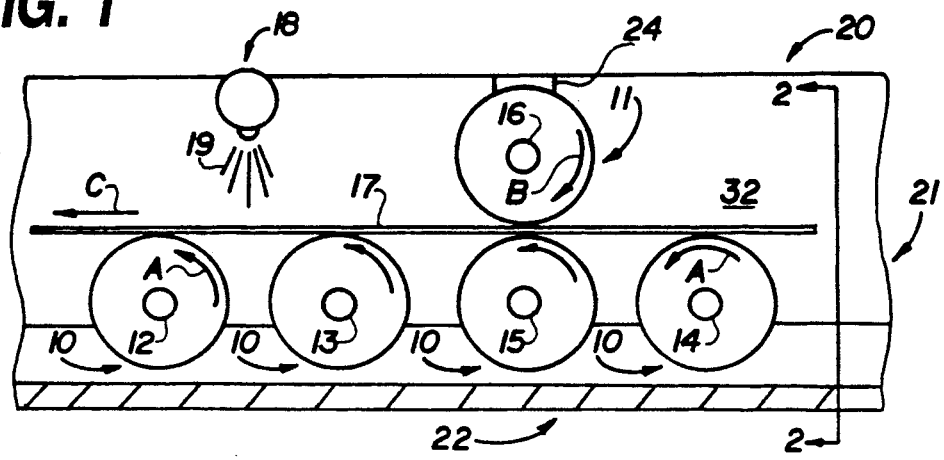
FIG. 1 is a side elevation view illustrating rotating disk assemblies constructed in accordance with the invention and utilized to apply fluid sprays to circuit board substrates.
Figure 2:
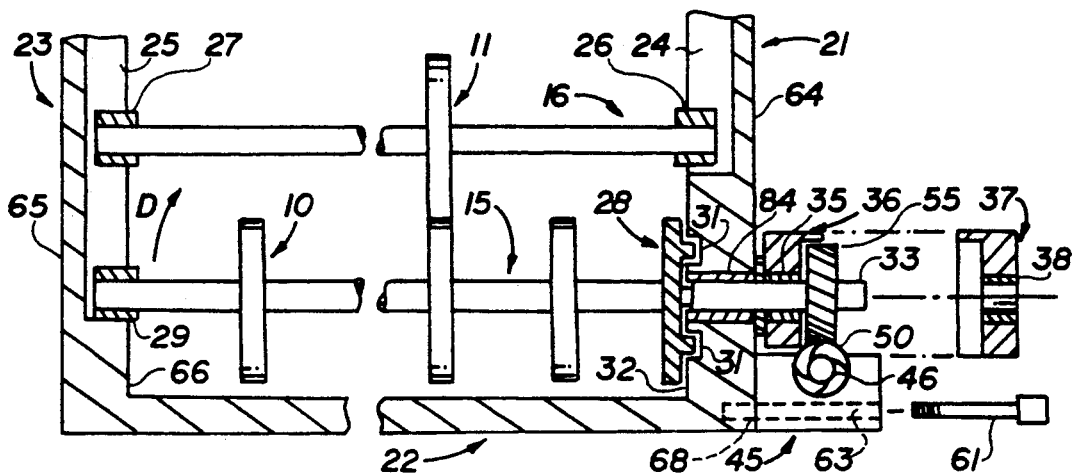
FIG. 2 is a side view of the circuit board processing apparatus of FIG. 1 illustrating in partial section view the drive mechanism used to provide motive power to rotate the disks assemblies.

Turning now to the drawings, which depict the presently preferred embodiments of the invention for the purpose of illustrating the practice thereof and not by way of limitation of the scope of the invention, and in which like reference characters refer to corresponding elements throughout the several views, FIGS. 1 to 2 illustrate a presently preferred embodiment of the invention including circular rollers, or disks, 10 fixedly carried on a plurality of spaced apart, parallel, generally horizontally oriented rotating lower axles 12, 13, 14, 15 and including circular rollers, or disks, 11 fixedly carried on generally horizontally oriented upper rotating axle 16. Rollers 10 rotate simultaneously with axles 12 to 15. Rollers 11 rotate simultaneously with axle 16. Axle 16 is parallel to axles 12 to 15. Axle 16 "floats" and rollers 11 function to hold a printed circuit board substrate 17 or other workpiece in position against the rollers 10 on the lower axles 12 to 15. More than one axle 16 can, if desired, be utilized. A horizontally oriented spray bar 18 directs fluid 19 against substrate 17. Axles 12 to 16 and spray bar 18 are mounted in a housing which includes bottom 22 and side walls 21, 23 connected to and upstanding from bottom 22. Rollers 10 each turn in the direction of arrows A and rollers 11 turn in the direction of arrows B to propel substrate 17 in the direction of arrow C in FIG. 1.

Figure 3:
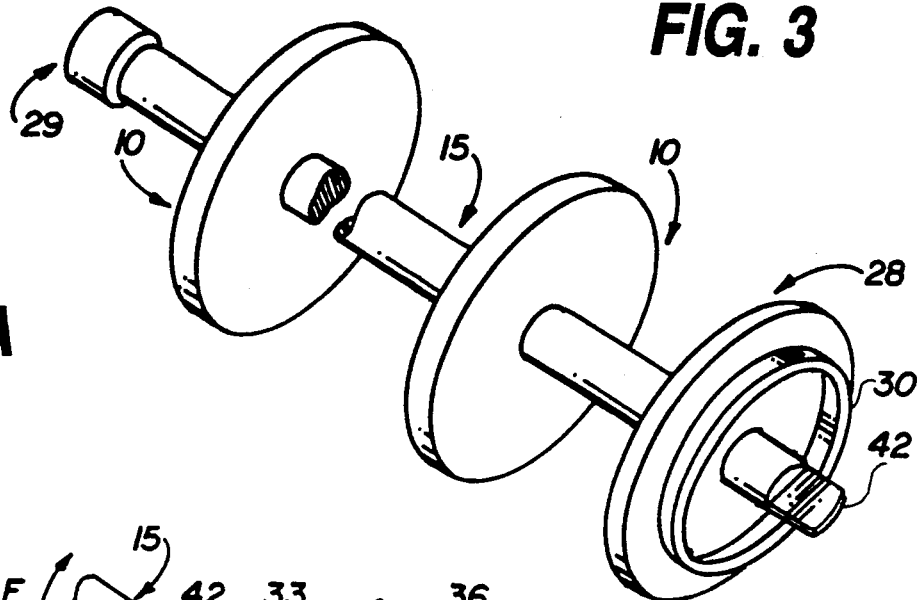
FIG. 3 is a perspective view illustrating one of the disk assemblies of FIGS. 1 and 2.
Figure 3A:
FIG. 3A is an end view of the disk assembly of FIG. 3 illustrating the tongue configuration of one end of the disk assembly.

FIG. 2 is a side view of the apparatus of FIG. 1 illustrating the drive system utilized to rotate axles 12 to 15. The substrate 17 has, for the sake of clarity, been omitted from FIG. 2. Bushings 26 and 27 are attached to the first and second ends of axle 16. Bushings 26 and 27 are slidably received by and vertically, slidably "float" in U-shaped slots 24 and 25, respectively, formed in side walls 21 and 23. The ability of axle 16, and disks 11 carried on axle 16, to float enables substrates of varying thickness to pass axles 16 and 15. The structure of axle 15 and disks 10 illustrated in FIGS. 2 and 3 is identical to the structure of axles 12, 13, 14. A circular end member 28 is fixedly secured to one end of axle 15 and to the same end of each of axles 12 to 14. Member 28 includes depending outwardly extending circular rail or lip 30. Rail 30 slidably turns in circular U-shaped groove 31 formed in the inner surface 32 of wall 21. Groove 31 and rail 30 comprise a "labyrinth seal". The member 28 on each axle 12 to 14 is slidably received by and turns in a circular U-shaped groove which is formed in the inner surface 32 of wall 21 and which has a size equivalent to that of groove 31. Bushing 29 is attached to the other end of axle 15 (and of axles 12 to 14). Bushing 29 is slidably received by slot 25 and can, as will be described, be lifted upwardly through an arc in the direction of arrow D to pivot axle 15 with respect to shaft 33. The bushing on one end of each axle 12 to 14 is slidably received by and slidably, vertically "floats" in a vertical U-shaped slot which is formed in the inner surface 66 of wall 23, is parallel to slot 25, and has a shape and dimension equal to that of slot 25.

Figure 4:
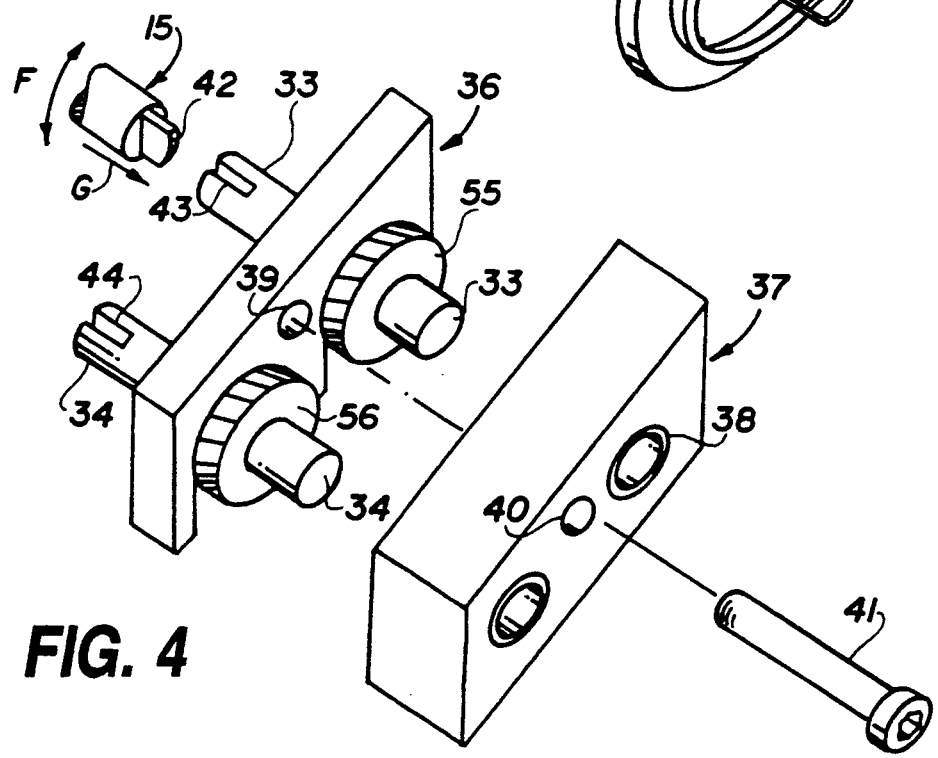
FIG. 4 is an exploded perspective view further illustrating components of the drive assembly of FIG. 2.

As shown in FIGS. 2 and 4, the housing for elongate cylindrical shafts 33, 34 and toothed gears 55, 56 includes members 36 and 37. Bushings 35 in member 36 each rotatably receive one of the ends of one of shafts 33, 34. Bushings 38 in member 37 each rotatably receive the other, outer end of one of shafts 33, 34. If desired, the outer end of each shaft 33, 34 need not extend into member 37 and bushings 38. Member 37 can be solid and not have apertures formed therethrough to receive bushings 38 and the outer ends of shafts 33, 34.

Cylindrical toothed gear 55 is fixedly attached to shaft 33. Toothed gear 56 is fixedly attached to shaft 34. U-shaped slot 43 is formed in one end of shaft 33 and slidably receives tongue 42 to interconnect axle 15 and shaft 33 such that axle 15 can be pivoted with respect to shaft 33 in the directions indicated by arrows F in FIG. 4. As would be appreciated by those of skill in the art, the shape and dimension of interconnected ends of axle 15 and shaft 33 can be varied (1) such that the interconnected ends can readily be slid together in the direction of arrow G and then slid apart, (2) such that axle 15 can be pivoted in at least one direction with respect to shaft 33, and (3) such that when shaft 33 is rotated in a direction circumscribing the co-linear longitudinal axes of shaft 33 and axle 15, axle 15 simultaneously rotates with shaft 33 about said longitudinal axes. Any of such various shapes and dimensions suit the purposes of the invention as long as the three afore-mentioned functions are fulfilled and axle 15 can be disengaged from shaft 33 without requiring that shaft 33 be removed from the processing apparatus of the invention. The inner slotted ends of shafts 33 and 34 are each slidably rotatably received by a cylindrical hollow bushing 84 mounted in and extending through wall 21.

The shape and dimension of shaft 34 is identical to that of shaft 33. Accordingly, the shape of slot 44 is the same as that of slot 43. Slot 44 receives the tongue 42 (not shown) on the end of shaft 14.

Bolt 41 slides through cylindrical apertures 39 and 40 and threads into an internally threaded aperture (not shown) formed in wall 21 so that bolt 41 secures members 36 and 37 together and against the flat outer surface 64 of wall 21. Wall 23 includes outer surface 65 and inner surface 66.

Figure 5:
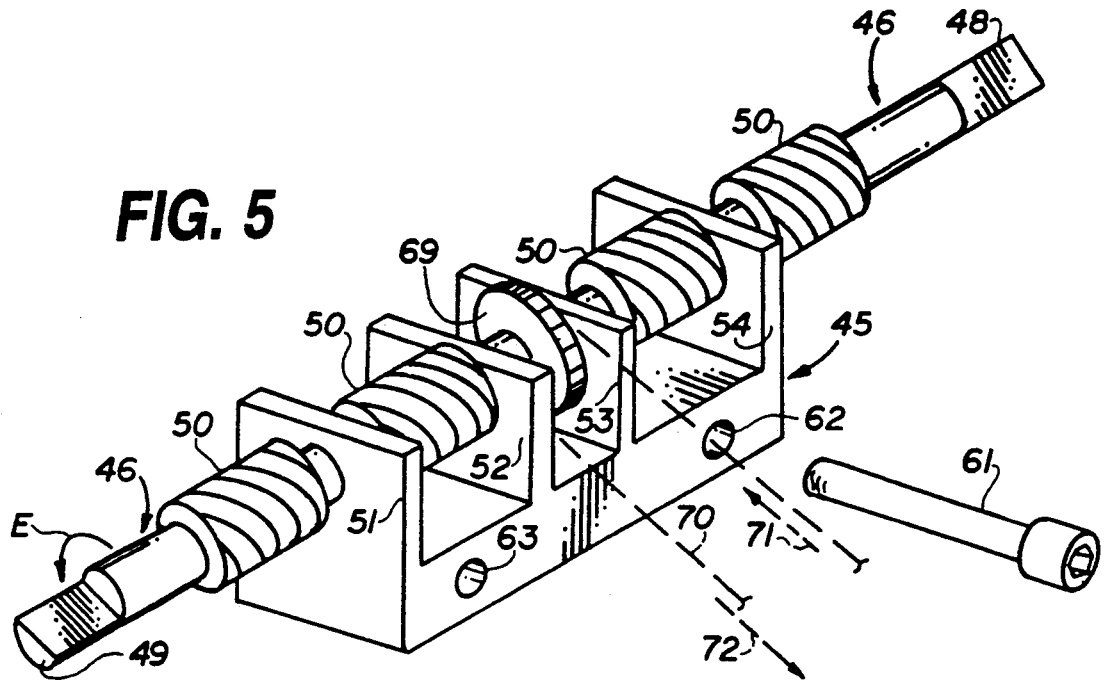
FIG. 5 is a perspective view further illustrating other components of the drive assembly of FIG. 2; and, FIG. 6 is a side diagrammatic view of the drive assembly of FIG. 2 illustrating the mode of operation thereof.

In FIG. 5, cylindrical toothed rollers 50 are fixedly attached to and rotate simultaneously with shaft 46. Shaft 46 includes semi-cylindrical tongue or end 49 and includes semi-cylindrical end 48. Each end 48, 49 slidably engages one end 48A, 49A of an adjacent, identical shaft 46 in the manner indicated by dashed lines 48A in FIG. 6 when two or more adjacent housings 45 are attached to the outer surface 64 such that the shafts 46 in the two adjacent housings are co-linear. Such a slidable engagement of the end pair 48A, 49 of adjacent shafts 46 permits one housing 45 to be removed from surface 64 without requiring that the adjacent housing 45 be removed. If desired, end 48 can be shaped like tongue 42 of axle 15 and end 49 can be shaped like the end of shaft 33 with slot 43. Such a construction permits, as does the tongue and groove construction illustrated in FIG. 4 for axle 15 and shaft 33, the end-pairs of adjacent colinear shafts 46 to be slidably engaged and would permit the end pair to be readily slidably disengaged when one housing 45 was being removed from the outer surface 64 of side wall 21.

Housing member 36 can be attached to housing 45 to form a unitary member having the general configuration illustrated in FIG. 2. When such a unitary housing member is removed from wall 21, shafts 33, 34, and 46 are simultaneously removed along with the unitary housing member.

Externally threaded screws 61 slide through apertures 62, 63 and are turned into internally threaded apertures 68 formed in outer surface 64 of wall 21 to removably secure housing 45 to wall 21. Sprocket 69 is fixedly attached to shaft 46 and is turned by a chain 70 to rotate shaft 46 in the direction of arrow E in FIG. 5 when housing 45 is secured to wall 21. Chain 70 moves in the directions indicated by arrows 71, 72 in FIG. 5. When shaft 46 turns in the direction indicated by arrow E, then gears 50, which each engage a gear 33, 34, 59, 60, cause gears 55, 56 and shafts 33, 34 and axles 14, 15 to rotate in the direction of arrow A indicated in FIG. 1.

Figure 6:
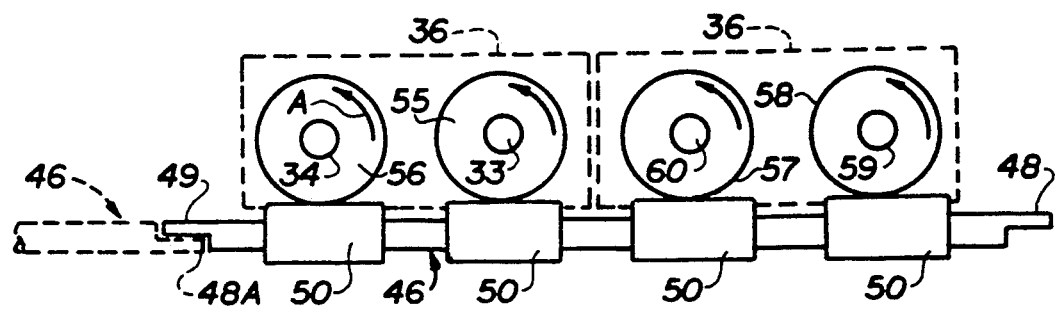

FIG. 6 is a side view of the apparatus of FIG. 2 illustrating only the drive assembly components of FIGS. 3, 4, and 5. Shaft 46 rotates and turns cylindrical gears 50. Each gear 50 engages and turns one of gears 55, 56, 57, 58. Gear 56 is fixedly attached to shaft 34. Shaft 34 engages the tongue 42 on one end of axle 14 and turns axle 14 when shaft 34 turns. Gear 55 is fixedly attached to shaft 33. Shaft 33 engages the tongue 42 on one end of axle 15 and turns axle 15 when shaft 33 turns. Gear 57 is fixedly attached to shaft 60. Shaft 60 engages the tongue 42 on one end of axle 13 and turns axle 13 when shaft 60 turns. Gear 58 is fixedly attached to shaft 59. Shaft 59 engages the tongue 42 on one end of axle 12 and turns axle 12 when shaft 59 turns. Each shaft 33, 34, 59, 60 is of equal size and dimension. Each gear 55, 56, 57, 58 is of equal size and dimension. In FIG. 6, a pair of shafts 33, 34; 59, 60 is mounted in each member 36 (member 37 is omitted for the sake of clarity). The mounting of two or more shafts in each member 36 is presently preferred, but is not required, in the practice of the invention. One or more shafts 33 can be mounted in a member 36, 37.

Each axle 12 to 15 is presently, but does not necessarily have to be, of equal shape and dimension and utilizes disks 10 of equal shape and dimension. Each axle 12 to 15 includes a member 28 mounted on the axle adjacent the end of the axle with tongue 42.

In use, the apparatus of the invention is assembled in the manner illustrated in FIGS. 1 and 2. If an axle 15 needs to be removed, the axle is pivoted upwardly in the direction of arrow D in FIG. 2 such that bushing 29 slides upwardly through slot 25. Axle 15 can pivot in the direction of arrow D when tongue 42 and slot 43 are generally in the vertical orientation illustrated in FIG. 4. After axle 15 is pivoted upwardly in the direction of arrow D, the axle is pulled away from shaft 33 such that tongue 42 slides outwardly away and free from slot 43.

The interconnected ends of axle 15 and shaft 33 can be configured such that axle 15 can be pivoted in any direction relative to shaft 33. For example, the end of shaft 33 can be provided with a semi-spherical type hollow and the end of axle 15 received by shaft 33 can be provided with a semi-spherical shape which loosely fits into the spherical hollow in the end of shaft 33.

If a gear 55 or shaft 33 needs to be replaced, then the screw 41 holding members 36, 37 is loosened and removed and members 36 and 37, shafts 33 and 34, and gears 55, 56 are pulled outwardly away from and free of wall 21 without requiring that adjacent members 36, 37 be removed from wall 21, without requiring that adjacent housings 45 be removed from wall 21, and without requiring that axles 12 to 15 be removed from their normal operative position between walls 21, 23. Similarly, individual housings 45 can each be removed from wall 21 by loosening and removing screws 61 and pulling the housing 45 free from wall 21. If there is an adjacent housing 45 and shaft 46, the end-pair 48A, 49 of the adjacent co-linear shafts 46 readily slides free from one another in the manner earlier described.

The drive assembly of the invention greatly simplifies the maintenance and repair of axles 12 to 15 and of the gears and shafts utilized to transmit motive power to each axle 12 to 15. The gears and shafts which transmit motive power to each driven axle 12 to 15 are not exposed to the fluids which contact a substrate processed by the apparatus. If desired axle 16 can also be driven.

Having described my invention in such terms as to enable those skilled in the art to understand and practice it and having identified the presently preferred embodiments and best mode thereof, I claim:

1. Processing apparatus including
   (a) a substrate having first and second opposed generally parallel planar surfaces co-terminating at the edge defining the periphery of said substrate;
   (b) a conveyor table for transporting said substrate, said conveyor table including
      (i) a frame including a pair of spaced apart upstanding first and second side wall means, each of said side wall means including an inner and an outer surface, the inner surfaces of said side wall means being exposed to fluid applied to said substrate, the outer surfaces of said side wall means facing outwardly away from the inner surfaces and generally not being exposed to contact by fluid applied to said substrate,
      (ii) a plurality of generally horizontally disposed spaced apart parallel axles mounted for rotation in said frame and each carrying a plurality of spaced apart circular rollers to support said first planar surface of said substrate in a generally horizontal orientation as said substrate is moved over said rollers, said axles each including a first end and a second end;
   (c) means for contacting said substrate with a fluid;
   (d) drive means for at least one of said axles, said drive means rotating said one of said axles and said circular rollers carried thereon to cause said substrate to move over said rollers and along said conveyor table in a direction of travel generally perpendicular to the longitudinal axes of said axles, said drive means including
      (i) a shaft rotatably mounted in said first side wall means and having an inner end removably engaging said first end of said one of said axles such that said one of said axles rotates simultaneously with said shaft, and an outer end extending outwardly from the outer surface of said first side wall,
      (ii) a gear attached to said outer end of said shaft, and
      (iii) means to rotate said gear, said shaft, and said one of said axles; said shaft being shaped and dimensioned such that when said shaft is pulled away from said first side wall means and said one of said axles, said inner end slides free from said first end of said axles and from said first side wall means.

2. The apparatus of claim 1 including a housing removably attached to the outer surface of said first side wall means such that
   (a) said outer end of said shaft extends outwardly from said outer surface of said first side wall and at least partially through said housing; and,
   (b) when said housing is detached and pulled away from said first side wall means, said inner end of said shaft can be slide (i) outwardly away from said first side wall means and said one of said axles, and
(ii) free from said first end of said axles and said first side wall means.

3. The apparatus of claim 1 including
(a) a circular groove formed in the inner surface of said first side wall means; and,
(b) a lip mounted on said one of said axles and extending into said circular groove; said lip contacting said groove to maintain said one of said axles in a selected position when said shaft is pulled outwardly away and free from said first end of said one of said axles.

4. Processing apparatus including
(a) a substrate having first and second opposed generally parallel planar surfaces co-terminating at the edge defining the periphery of said substrate;
(b) a conveyor table for transporting said substrate, said conveyor table including
(i) a frame including a pair of spaced apart upstanding first and second side wall means, each of said side wall means including an inner and an outer surface, the inner surfaces of said side wall means being exposed to fluid applied to said substrate, the outer surfaces of said side wall means facing outwardly away from the inner surfaces and generally not being exposed to contact by fluid applied to said substrate,
(ii) a plurality of generally horizontally disposed spaced apart parallel axles mounted for rotation in said frame and each carrying a plurality of spaced apart circular rollers to support said first planar surface of said substrate in a generally horizontal orientation as said substrate is moved over said rollers, said axles each including a first end and a second end, said inner surfaces of said first and second side wall means facing and bounding said rollers;
(c) means for contacting said substrate with a fluid;
(d) drive means for at least one of said axles, said drive means rotating one of said axles and said circular rollers carried thereon to cause said substrate to move over said rollers and along said conveyor table in a direction of travel generally perpendicular to the longitudinal axes of said axles, said drive means including
(i) a first shaft rotatably mounted in said first side wall means and having an inner end engaging said first end of said one of said axles such that said one of said axles rotates simultaneously with said first shaft, and an outer end extending outwardly from the outer surface of said first side wall, and,
(ii) a first gear attached to said outer end of said shaft;
(e) transmission means to rotate said gear, said shaft, and said one of said axles, said transmission means including
(i) a housing removably attached to the outer surface of said first wall means,
(ii) a second shaft rotatably mounted in said housing, and
(iii) a second gear carried on said shaft and engaging and turning said first gear; and,
(f) motive power means for rotating said second shaft.

5. The apparatus of claim 4 wherein said motive power means includes a rotatable third shaft connected to and engaging said second shaft to rotate said second shaft with said third shaft such that when said housing is detached from said first wall means, said second shaft can be slid free from engagement with said third shaft.

* * * * *